(12) United States Patent
Gabrys et al.

(10) Patent No.: US 8,390,025 B2
(45) Date of Patent: Mar. 5, 2013

(54) INDUCTIVELY COUPLED PHOTODETECTOR AND METHOD OF FORMING AN INDUCTIVELY COUPLED PHOTODETECTOR

(75) Inventors: Ann Gabrys, Santa Clara, CA (US); Peter J. Hopper, San Jose, CA (US); William French, San Jose, CA (US); Kyuwoon Hwang, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 319 days.

(21) Appl. No.: 13/004,803

(22) Filed: Jan. 11, 2011

(65) Prior Publication Data

US 2012/0175676 A1 Jul. 12, 2012

(51) Int. Cl.
*H01L 31/02* (2006.01)
*H01L 31/0336* (2006.01)
(52) U.S. Cl. ......... 257/184; 257/E31.005; 257/E31.111; 438/59; 438/94
(58) Field of Classification Search .......... 257/184–189, 257/E31.005, E31.111, E33.048; 438/59, 438/94
See application file for complete search history.

(56) References Cited

U.S. PATENT DOCUMENTS 6,885,040 B2 * 4/2005 Kim et al. ............... 257/186

OTHER PUBLICATIONS

Yammouch, T. et al., "Physical Modeling of MEMS Variable Inductor", IEEE Transactions on Circuits and Systems-II: Express Briefs, vol. 55, No. 5, 2008, pp. 419-422.

* cited by examiner

*Primary Examiner* — Julio J Maldonado
*Assistant Examiner* — Daniel Shook
(74) *Attorney, Agent, or Firm* — Eugene C. Conser; Wade J. Brady, III; Frederick J. Telecky, Jr.

(57) ABSTRACT

A photodetector detects the absence or presence of light by detecting a change in the inductance of a coil. The magnetic field generated when a current flows through the coil passes through an electron-hole generation region. Charged particles in the electron-hole generation region come under the influence of the magnetic field, and generate eddy currents whose magnitudes depend on whether light is absent or present. The eddy currents generate a magnetic field that opposes the magnetic field generated by current flowing through the coil.

20 Claims, 9 Drawing Sheets

INDUCTIVELY COUPLED PHOTODETECTOR AND METHOD OF FORMING AN INDUCTIVELY COUPLED PHOTODETECTOR

BACKGROUND OF THE INVENTION

1. Field of the Invention

The present invention relates to photodetectors and, more particularly, to an inductively-coupled photodetector and a method of forming an inductively-coupled photodetector.

2. Description of the Related Art

A photodetector is a device that detects the presence or absence of light. A photodiode is a type of photodetector that is commonly formed by combining a p-type material with an n-type material. When exposed to electromagnetic radiation, such as infrared (IR), visible, and ultraviolet (UV) light, a photodiode generates a number of electron-hole pairs at different depths within the device depending upon the depth at which the electromagnetic radiation was absorbed by the device.

Black and white photodiodes are photodiodes that can collect photons over all or substantially all of the visible spectrum, which includes many colors, and therefore generate electron-hole pairs over a large vertical range within the photodiode. On the other hand, wavelength-limited or color photodiodes are photodiodes that collect photons over a much narrower range of wavelengths, such as UV, blue, green, red, or IR, and therefore generate electron-hole pairs over a much smaller vertical range within the photodiode.

Wavelength-limited or color photodiodes are commonly formed as a filtered device by adding a filter to a black and white photodiode. For example, a red wavelength-limited photodiode can be implemented by placing a red filter over a black and white photodiode. The red filter, in turn, only allows red light to enter the photodiode. Thus, although a black and white photodiode is capable of capturing a wider range of the visible light spectrum, the color filter limits the photodiode to collecting only a single color.

Wavelength-limited or color photodiodes are also commonly formed as unfiltered devices by adjusting the depth of the pn junction within the diode. For example, UV light has an absorption depth of less than approximately 0.7 microns, while IR light has an absorption depth of more than approximately 1.2 microns. Thus, an IR photodiode can be formed by utilizing a small depletion region 114 that lies across substantially only the absorption depth of IR light to collect only IR light.

FIG. 1 shows a cross-sectional diagram that illustrates a prior-art IR photodiode 100. As shown in FIG. 1, IR photodiode 100 includes a p-type (boron) region 110, such as a substrate, an n-type region 112, such as an epitaxial layer or well, that overlies and contacts p-type region 110, and a depletion region 114 that is formed across the pn junction between p-type region 110 and n-type region 112.

Photodiode 100 can be formed as a filtered device, e.g., as a black and white device with a large depletion region 114 (that lies across the absorption depths of a number of wavelengths of light), and an IR filter that allows only IR light to enter photodiode 100. Photodiode 100 can alternately be formed as an unfiltered device, e.g., as a device with a small depletion region 114 (that lies substantially only across the absorption depth of IR light) that collects only IR light. Further, photodiode 100 includes an isolation region 116, such as oxide, that is formed on n-type region 112.

In operation, IR photodiode 100 is first reset by placing a reset voltage on n-type region 112 that reverse biases the pn junction. The reverse-biased voltage, which sets up an electric field across the junction, increases the width of depletion region 114 so that the IR portion of the electromagnetic spectrum can be absorbed in depletion region 114.

Once photodiode 100 is reset, photodiode 100 is then exposed to a source of electromagnetic radiation for an integration period. When photodiode 100 is struck by infrared radiation during the integration period, the radiation penetrates into the semiconductor material down to an absorption depth where the IR wavelengths of light are absorbed in depletion region 114.

The IR wavelengths of light absorbed in depletion region 114 generate a number of electron-hole pairs in depletion region 114. The electric field set up across the reverse-biased pn junction attracts the electrons that are formed in depletion region 114 (along with the electrons that are formed in p-type region 110 within a diffusion length of depletion region 114) to n-type region 112 where each additional electron reduces the magnitude of the reset voltage that was placed on n-type region 112.

Thus, at the end of the integration period, the total number of electrons collected by n-type region 112 has reduced the reset voltage to an integrated voltage. As a result, the total number of electrons collected by n-type region 112 during the integration period, which is a measure of the intensity of the received IR electromagnetic radiation, can be determined by subtracting the integrated voltage from the reset voltage.

As a result, photodiode 100 can be utilized as a photodetector by indicating the absence of IR light when the difference between the reset voltage and the integrated voltage is small and lies within a range of values, and indicating the presence of IR light when the difference between the reset voltage and the integrated voltage is large and lies outside of the range of values.

BRIEF DESCRIPTION OF THE DRAWINGS

FIG. 2A is a plan view, while FIG. 2B is a cross-sectional view taken along line 2B-2B of FIG. 2A.

DETAILED DESCRIPTION OF THE INVENTION

Figure 1:
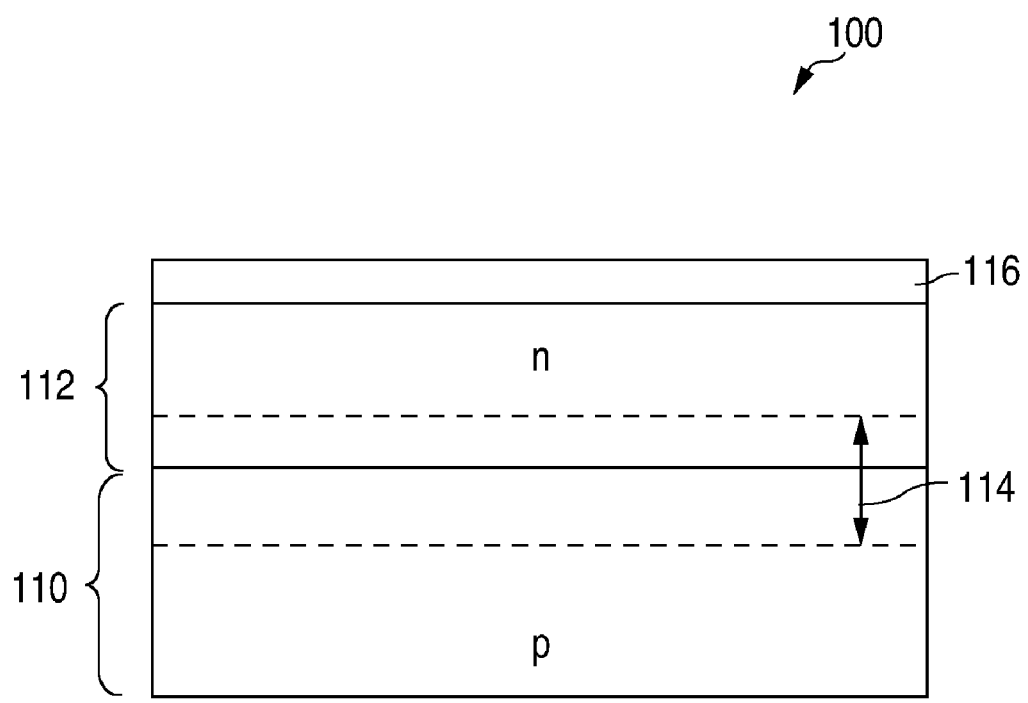
FIG. 1 is a cross-sectional diagram illustrating a prior-art IR photodiode 100.
Figure 2A:
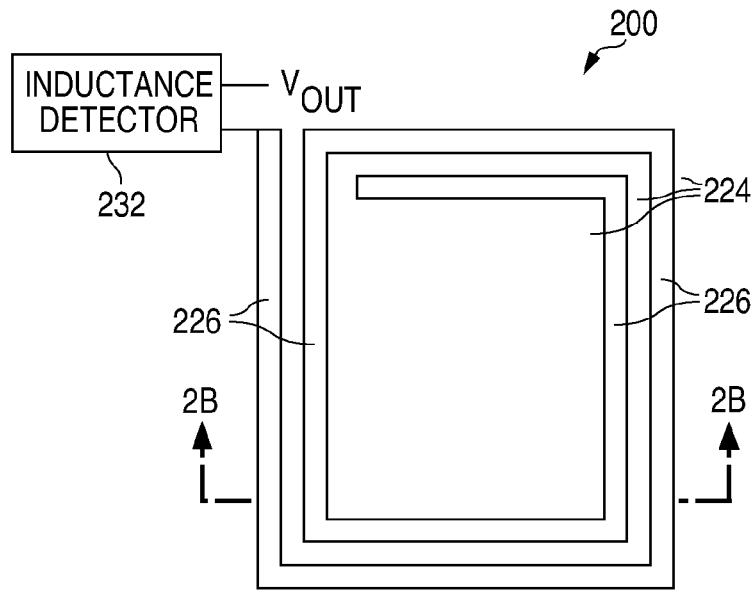
FIGS. 2A-2B are views illustrating an inductively-coupled photodetector 200 in accordance with the present invention.
Figure 2B:
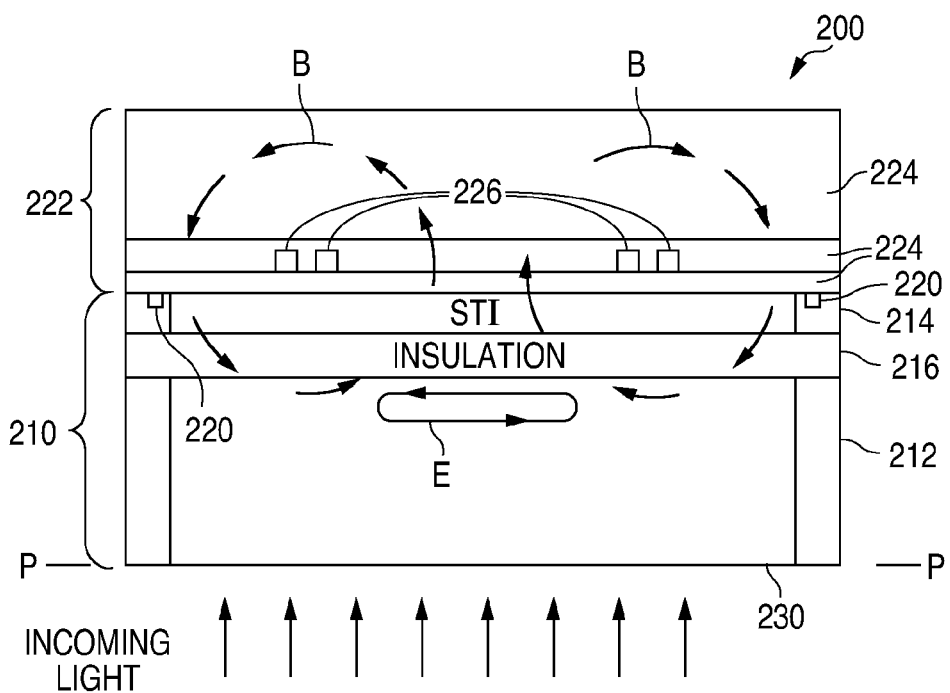

FIGS. 2A-2B show views that illustrate an inductively-coupled photodetector 200 in accordance with the present invention. FIG. 2A shows a plan view, while FIG. 2B shows a cross-sectional view taken along line 2B-2B of FIG. 2A. As described in greater detail below, the present invention utilizes optically-enhanced eddy currents to vary the strength of a magnetic field, where variations in the strength of the magnetic field indicate the absence or presence of light.

As shown in FIGS. 2A-2B, photodetector 200 includes a semiconductor structure 210 that has a bulk semiconductor region 212, a substrate 214, and an insulation region 216 that lies between, touches, and electrically isolates bulk semiconductor region 212 from substrate 214. In the present example, both bulk semiconductor region 212 and substrate 214 are implemented with single-crystal silicon, which is an indirect band gap material, and have a conductivity type such as p-type. Thus, in the present example, semiconductor structure 210 is a silicon-on-insulator (SOI) structure.

In addition, photodetector 200 has a number of electrical devices 220 that are formed in and on substrate 214. The electrical devices 220 include, for example, transistors, resistors, capacitors, and diodes.

Photodetector 200 also has a shallow trench isolation region STI that is formed completely through a portion of substrate 214 to touch the top surface of insulation region 216.

Further, photodetector 200 has a metal interconnect structure 222 that includes a number of layers of metal traces, a number of contacts and vias, and a non-conductive region 224 that touches the metal traces, contacts, and vias. Non-conductive region 224 touches the top surface of substrate 214.

In addition, one of the metal layers includes a coil 226 that touches non-conductive region 224. The contacts extend through portions of non-conductive region 224 to make electrical connections between device regions in and on substrate 214 and the first level of metal traces, while the vias extend through portions of non-conductive region 224 to make inter-level connections between the layers of metal traces. Metal interconnect structure 222 electrically connects the devices 220 and coil 226 together to form an electrical circuit.

In the present example, coil 226 is formed as a planar spiral inductor in the first metal layer of metal interconnect structure 222. Coil 226 can alternately be formed in metal layers other than the first metal layer of metal interconnect structure 222, but is preferably formed close to the top surface of substrate 214.

In accordance with the present invention, photodetector 200 includes an electron-hole generation region 230 that is formed in the back side of semiconductor structure 210 to touch bulk semiconductor region 212 and the bottom surface of insulation region 216. As shown, no portion of electron-hole generation region 230 lies above the top surface of bulk semiconductor region 212.

Further, the bottom surface of electron-hole generation region 230 and the bottom surface of bulk semiconductor region 212 lie substantially in a common horizontal plane P. In addition, the shallow trench isolation region STI lies directly vertically above electron-hole generation region 230, and directly vertically below coil 226. Thus, as shown, only a non-conductive region lies vertically between coil 226 and electron-hole generation region 230.

Electron-hole generation region 230 is implemented with a material that generates a larger number of electron-hole pairs in electron-hole generation region 230 than are generated in an equivalently-sized region of bulk semiconductor region 212 when subject to equivalent input light conditions. In addition, the electron-hole pairs in electron-hole generation region 230 have shorter recombination lifetimes than do electron-hole pairs in an equivalently-sized region of bulk semiconductor region 212.

In the present example, electron-hole generation region 230 is implemented with a direct band gap material, while bulk semiconductor region 212 is implemented with an indirect band gap material. As a result of using a direct band gap material, a larger number of electron-hole pairs are generated in electron-hole generation region 230 than are generated in an equivalently-sized region of indirect band gap material when subject to equivalent input light conditions. In addition, the electron-hole pairs in electron-hole generation region 230 have shorter recombination lifetimes than do electron-hole pairs in an equivalently-sized region of indirect band gap material.

For example, electron-hole generation region 230 can be implemented with a region of amorphous gallium arsenic (GaAs). GaAs, a direct band gap material, generates more electron-hole pairs that an equivalent region of single-crystal silicon, an indirect band gap material, in response to the same input IR light conditions. In addition, the recombination lifetimes of electron-hole pairs in GaAs are shorter than the recombination lifetimes of electron-hole pairs in single-crystal silicon.

In operation, a light source, such as a fiber optic cable, is directed at electron-hole generation region 230. In addition, when a DC current flows through coil 226, a magnetic field B is created around coil 226. In accordance with the present invention, as shown in FIGS. 2A-2B, the magnetic field B extends through substrate 214 and insulation region 216 into electron-hole generation region 230.

When no light is received from the light source by electron-hole generation region 230, the strength of the magnetic field B is limited by the effects of eddy currents E. When free charged particles (e.g., electrons and holes) in electron-hole generation region 230 come under the influence of the magnetic field B, the free charged particles create eddy currents E which flow in a circular pattern that is perpendicular to the magnetic field B. The eddy currents E, in turn, create corresponding magnetic fields that oppose, and thereby reduce the strength of, the magnetic field B.

However, when light is received from the light source by electron-hole generation region 230, the strength of the magnetic field B is substantially reduced by the effects of the eddy currents E. The effects of the eddy currents E are significantly worse when light is present than when light is not present. This is because when light is absorbed by electron-hole generation region 230, a large number of electron-hole pairs are generated in electron-hole generation region 230.

The photogenerated electron-hole pairs in electron-hole generation region 230 substantially increase the number of charged particles that are available to participate in the eddy currents. Thus, the increased number of charged particles substantially increases the magnitudes of the eddy currents E.

When the magnitudes of the eddy currents E are substantially increased, the strength of the magnetic field that is created by the eddy currents E is also substantially increased. Since the magnetic field generated by the eddy currents E opposes the magnetic field B, the increased opposing magnetic field from the increased magnitudes of the eddy currents substantially reduces the strength of the magnetic field B.

Thus, the magnetic field B generated by a current flowing through coil 226 has a first strength when electron-hole generation region 230 is exposed to a wavelength of light, and a second strength when electron-hole generation region 230 is exposed to no light, where the second strength is different from the first strength.

The inductance L of a coil is defined by: $L = NI\mu/B$, where N is the number of turns of the coil, I is the magnitude of the current flowing through the coil, $\mu$ is the permeability of the core material (the material the magnetic field passes through), and B is the magnetic field. Thus, the inductance L of a coil is proportional to the magnitude of the magnetic field B.

As a result, the change in the strengths of the magnetic fields due to the absence or presence of light can be detected by a change in the inductance. Therefore, the inductance generated by a current flowing through coil 226 has a first value when electron-hole generation region 230 is exposed to a wavelength of light, and a second value when electron-hole generation region 230 is exposed to no light, where the second value is different from the first value.

A change in inductance, in turn, can be detected by an inductance detector, i.e., a circuit which outputs a value that varies in response to variations in the inductance. As further shown in FIGS. 2A-2B, coil 226 is electrically connected to an inductance detector 232 to measure changes in inductance. Inductance detector 232, which is realized with the devices 220, can be implemented in a number of different ways to detect changes in inductance. For example, an inductance detector can be implemented with an AC signal source and a conventional band-pass filter.

Figure 3A:
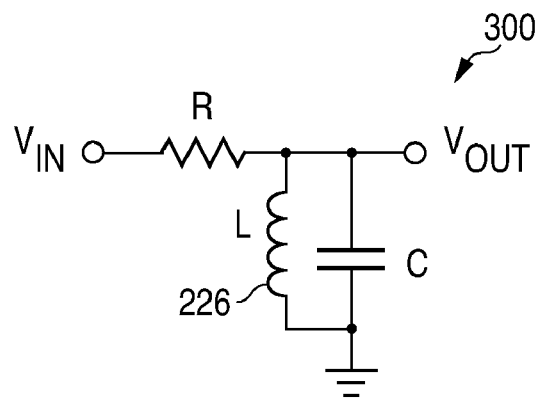
FIG. 3A is a circuit diagram illustrating an example of a band pass filter 300 in accordance with the present invention.
Figure 3B:
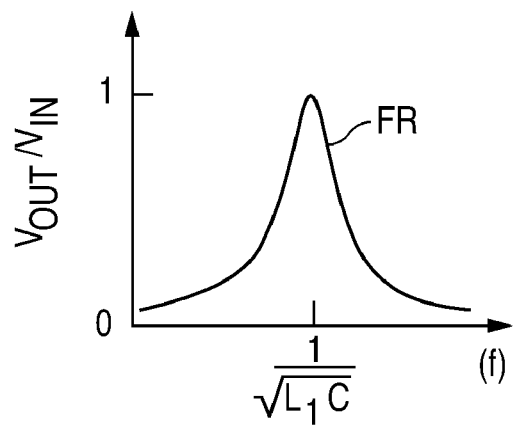
FIGS. 3B-3C are graphs illustrating the operation of band pass filter 300 in accordance with the present invention.
Figure 3C:
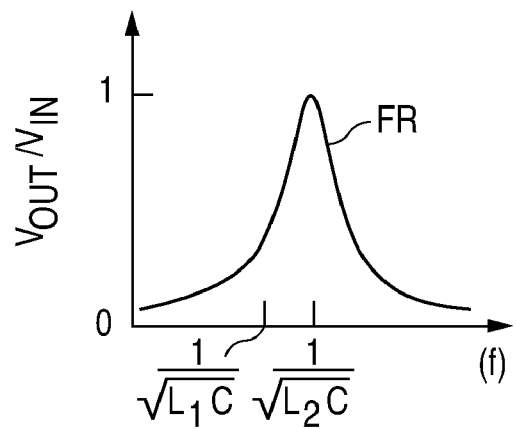

FIG. 3A shows a circuit diagram that illustrates an example of a band pass filter 300 in accordance with the present invention. FIGS. 3B-3C show graphs that illustrate the operation of band pass filter 300 in accordance with the present invention. As shown in FIG. 3A, band pass filter 300 includes an inductor L, which is implemented with inductor 226, and a capacitor C which are connected in parallel between $V_{OUT}$ and ground, and a resistor R that is connected between the AC input signal $V_{IN}$ and $V_{OUT}$.

FIG. 3B shows the frequency response FR of band pass filter 300 when no light is present, which illustrates that the center frequency of band pass filter 300 is equal to $1/\sqrt{L_1C}$. Thus, when no light is present and the AC input signal $V_{IN}$ has a frequency of $1/\sqrt{L_1C}$, band pass filter 300 passes substantially all of the AC input signal $V_{IN}$.

FIG. 3C shows the frequency response FR of band pass filter 300 when light is present, which illustrates that the center frequency of band pass filter 300 has shifted to $1/\sqrt{L_2C}$ due to the change in inductance. Thus, when light is present and the AC input signal $V_{IN}$ has a frequency of $1/\sqrt{L_1C}$, band pass filter 300 substantially attenuates the AC input signal. Thus, the change in amplitude of the AC signal indicates whether light is absent or present.

Figure 4A:
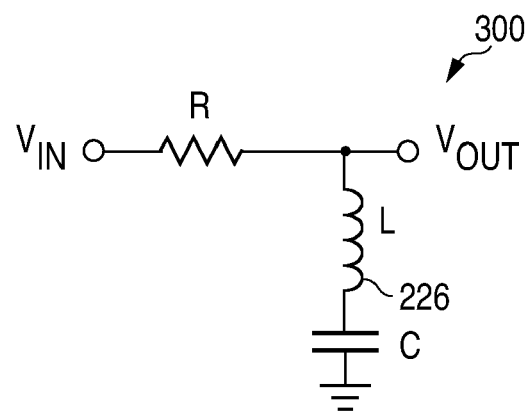
FIG. 4A is a circuit diagram illustrating an example of a notch filter 400 in accordance with the present invention.
Figure 4B:
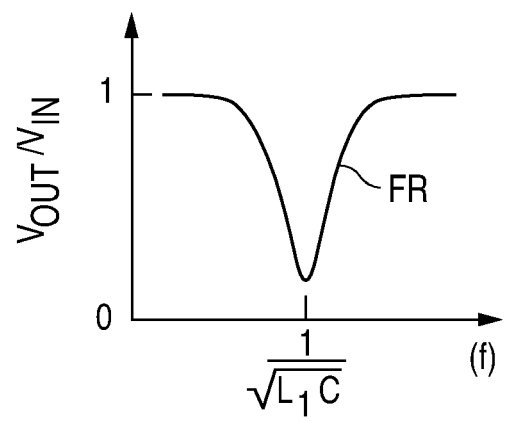
FIGS. 4B-4C are graphs illustrating the operation of notch filter 400 in accordance with the present invention.
Figure 4C:
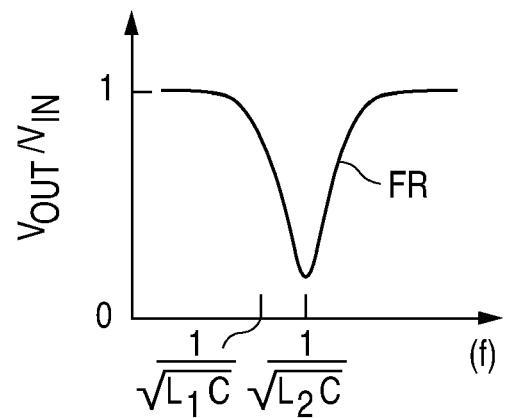

An inductance detector can also be implemented with an AC signal source and a conventional notch filter. FIG. 4A shows a circuit diagram that illustrates an example of a notch filter 400 in accordance with the present invention. FIGS. 4B-4C show graphs that illustrate the operation of notch filter 400 in accordance with the present invention. As shown in FIG. 4A, notch filter 400 includes an inductor L, which is implemented with inductor 226, and a capacitor C connected in series between $V_{OUT}$ and ground, and a resistor R that is connected between the AC input signal $V_{IN}$ and $V_{OUT}$.

FIG. 4B shows the frequency response FR of notch filter 400 when no light is present, which illustrates that the center frequency of notch filter 400 is also equal to $1/\sqrt{L_1C}$. Thus, when no light is present and the AC input signal $V_{IN}$ has a frequency of $1/\sqrt{L_1C}$, notch filter 400 attenuates substantially all of the AC input signal $V_{IN}$.

FIG. 4C shows the frequency response FR of notch filter 400 when light is present, which illustrates that the center frequency of notch filter 400 has shifted to $1/\sqrt{L_2C}$ due to the change in inductance. Thus, when light is present and the AC input signal $V_{IN}$ has a frequency of $1/\sqrt{L_1C}$, notch filter 400 passes substantially more of the AC input signal $V_{IN}$. Thus, the change in amplitude of the AC signal again indicates whether light is absent or present.

Figure 5:
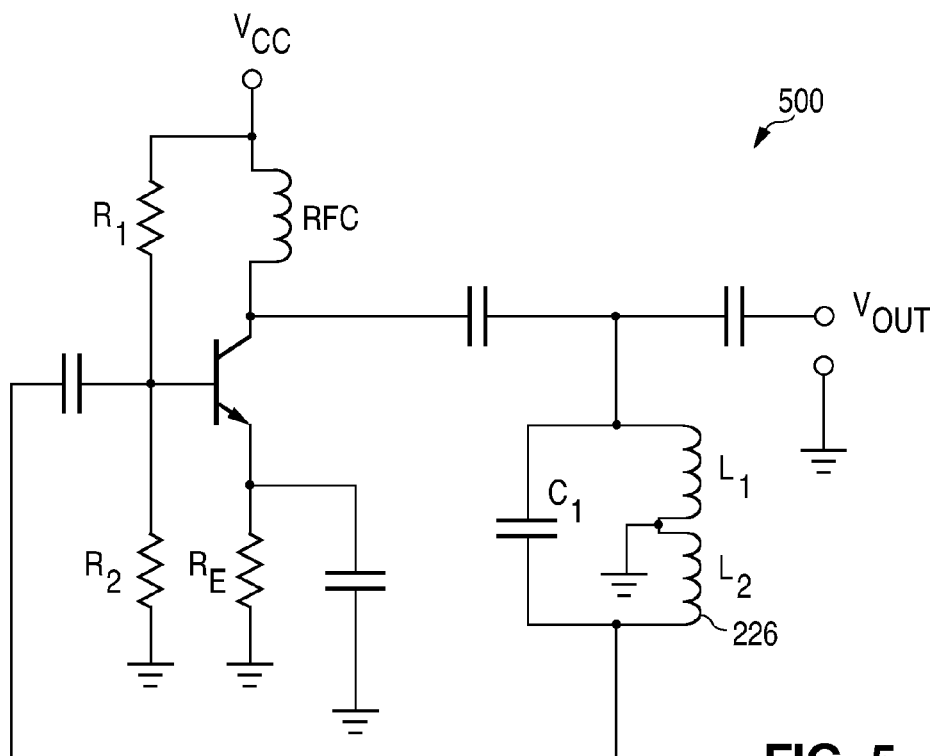
FIG. 5 is a circuit diagram illustrating an example of a Hartley oscillator 500 in accordance with the present invention.

An inductance detector can further be implemented with an oscillator, such as a Hartley oscillator or a Colpitts oscillator, which indicates a change in inductance by a change in frequency. FIG. 5 shows a circuit diagram that illustrates an example of a Hartley oscillator 500 in accordance with the present invention, while FIG. 6 shows a circuit diagram that illustrates an example of a Colpitts oscillator 600 in accordance with the present invention.

As shown in FIG. 5, Hartley oscillator 500 includes an inductor $L_1$ and an inductor $L_2$, one of which is implemented with inductor 226. The total inductance $L_T$ of oscillator 500 is equal to $L_T=L_1+L_2$. The frequency output by oscillator 500 is equal to $f=1/2\pi\sqrt{L_TC_1}$. Thus, since the frequency is a function of the inductance, the change in frequency of the AC signal indicates whether light is absent or present.

Figure 6:
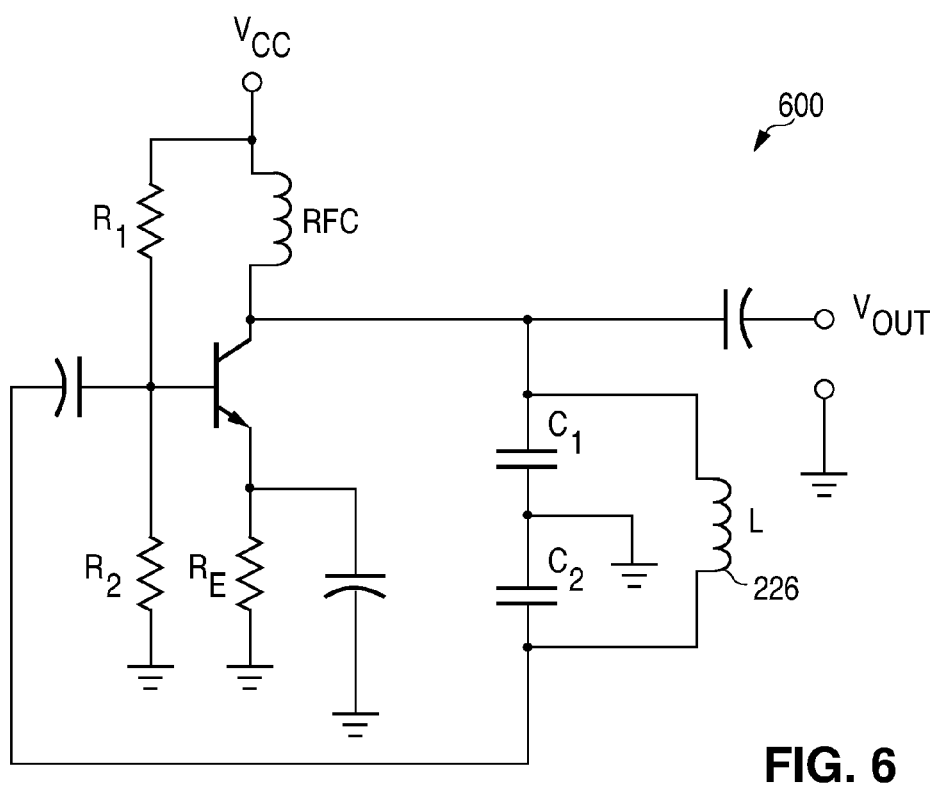
FIG. 6 is a circuit diagram illustrating an example of a Colpitts oscillator 600 in accordance with the present invention.

As shown in FIG. 6, Colpitts oscillator 600 includes an inductor L, which is implemented with inductor 226, a capacitor $C_1$, and a capacitor $C_2$. The total capacitance $C_T$ of oscillator 600 is equal to $C_T=C_1C_2/C_1+C_2$. The frequency output by oscillator 600 is equal to $f=1/2\pi\sqrt{LC_T}$. Thus, since the frequency is a function of the inductance, the change in frequency of the AC signal indicates whether light is absent or present.

Figure 7A:
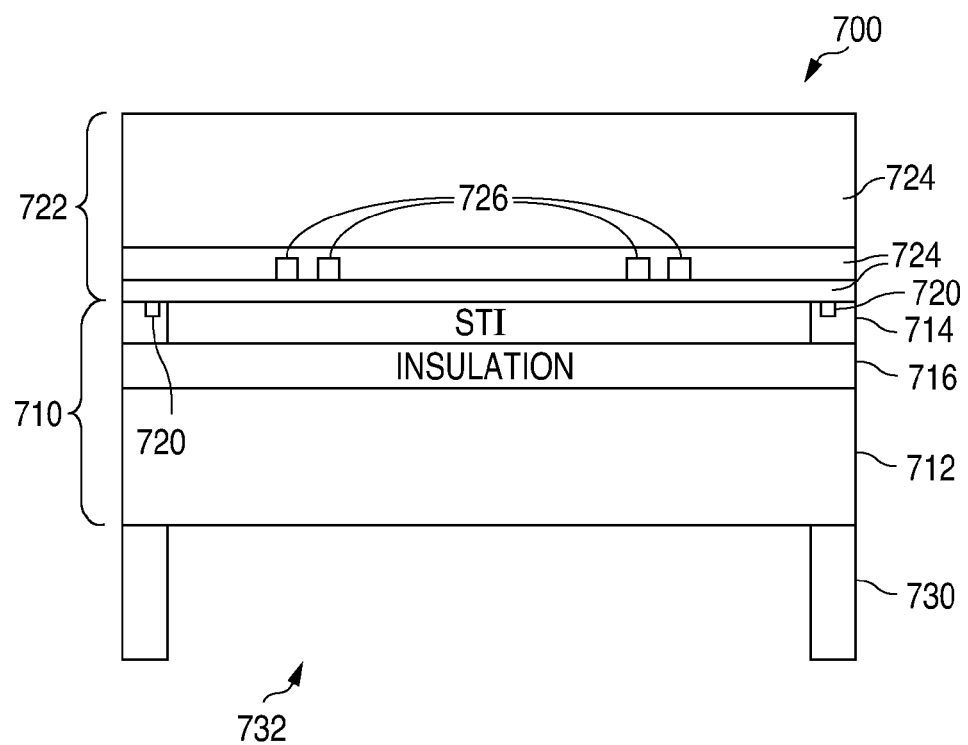
FIGS. 7A-7D are cross-sectional views illustrating a method of forming an inductively-coupled photodetector in accordance with the present invention.

FIGS. 7A-7D show cross-sectional views that illustrate a method of forming an inductively-coupled photodetector in accordance with the present invention. As shown in FIG. 7A, the method utilizes a conventionally-formed semiconductor wafer 700. Wafer 700 includes a semiconductor structure 710 that has a bulk semiconductor region 712, a substrate 714, and an insulation region 716 that lies between, touches, and electrically isolates bulk semiconductor region 712 from substrate 714. In the present example, both bulk semiconductor region 712 and substrate 714 are implemented with single-crystal silicon, which is an indirect band gap material, and have a conductivity type such as p-type.

In addition, wafer 700 has a number of electrical devices 720 that are formed in and on substrate 714. The electrical devices 720 include, for example, transistors, resistors, capacitors, and diodes. Wafer 700 also has a shallow trench isolation region STI that is formed completely through a portion of substrate 714 to touch the top surface of insulation region 716.

Further, wafer 700 has a metal interconnect structure 722 that includes a number of layers of metal traces, a number of contacts and vias, and a non-conductive region 724 that touches the metal traces, contacts, and vias. Non-conductive region 724 touches the top surface of substrate 714.

In addition, one of the metal layers includes a coil 726 that touches non-conductive region 724. The contacts extend through portions of non-conductive region 724 to make electrical connections between device regions in and on substrate 714 and the first level of metal traces, while the vias extend through portions of non-conductive region 724 to make inter-level connections between the layers of metal traces. Metal interconnect structure 722 electrically connects the devices 720 and coil 726 together to form an electrical circuit.

In the present example, coil 726 is formed as a planar spiral inductor in the first metal layer of metal interconnect structure 722. Coil 726 can alternately be formed in metal layers other than the first metal layer of metal interconnect structure 722, but is preferably formed close to the top surface of substrate 714.

Referring again to FIG. 7A, the method begins by back grinding wafer 700 to reduce the thickness of bulk semiconductor region 712. After this, a patterned photoresist layer 730 is formed on the bottom surface of thinned bulk semiconductor region 712. Patterned photoresist layer 730 has a photoresist opening 732 that exposes the bottom surface of thinned bulk semiconductor region 712.

Patterned photoresist layer 730 is formed in a conventional manner, which includes depositing a layer of photoresist, projecting a light through a patterned black/clear glass plate known as a mask to form a patterned image on the layer of photoresist, and removing the imaged photoresist regions, which were softened by exposure to the light.

Figure 7B:
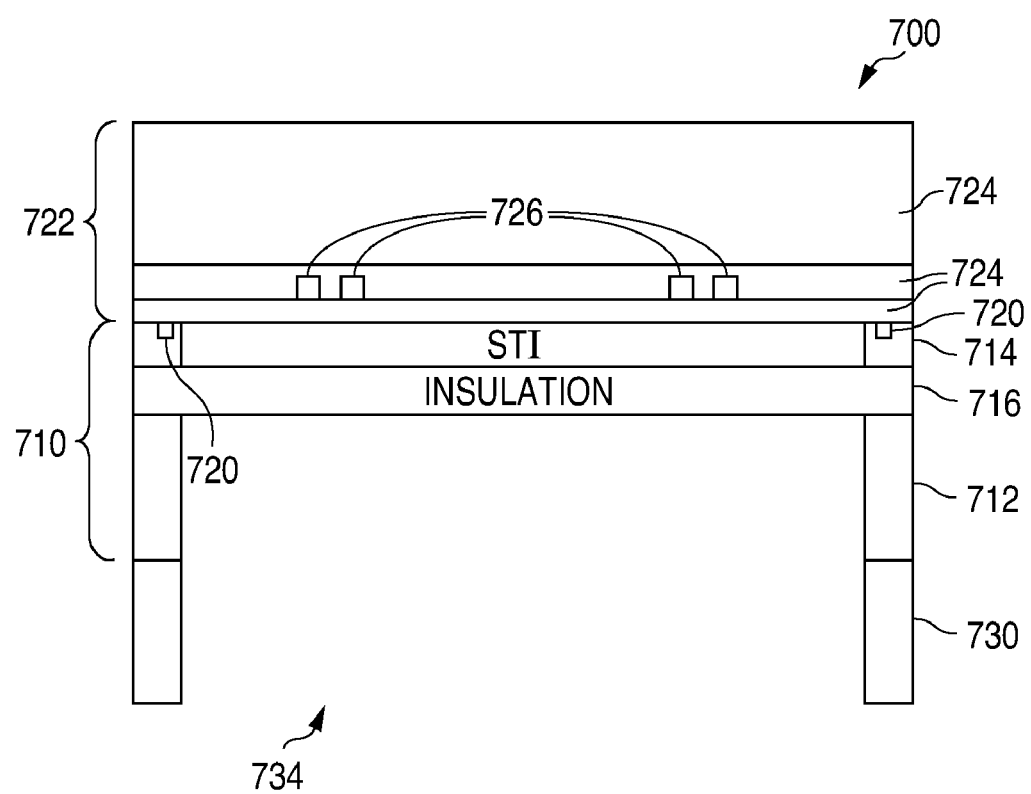

As shown in FIG. 7B, after patterned photoresist layer 730 has been formed, the exposed region of thinned bulk semiconductor region 712 is etched in a conventional manner to form an opening 734 that exposes the bottom surface of insulation layer 716. Patterned photoresist layer 730 is then removed using well-known solvents and procedures.

Figure 7C:
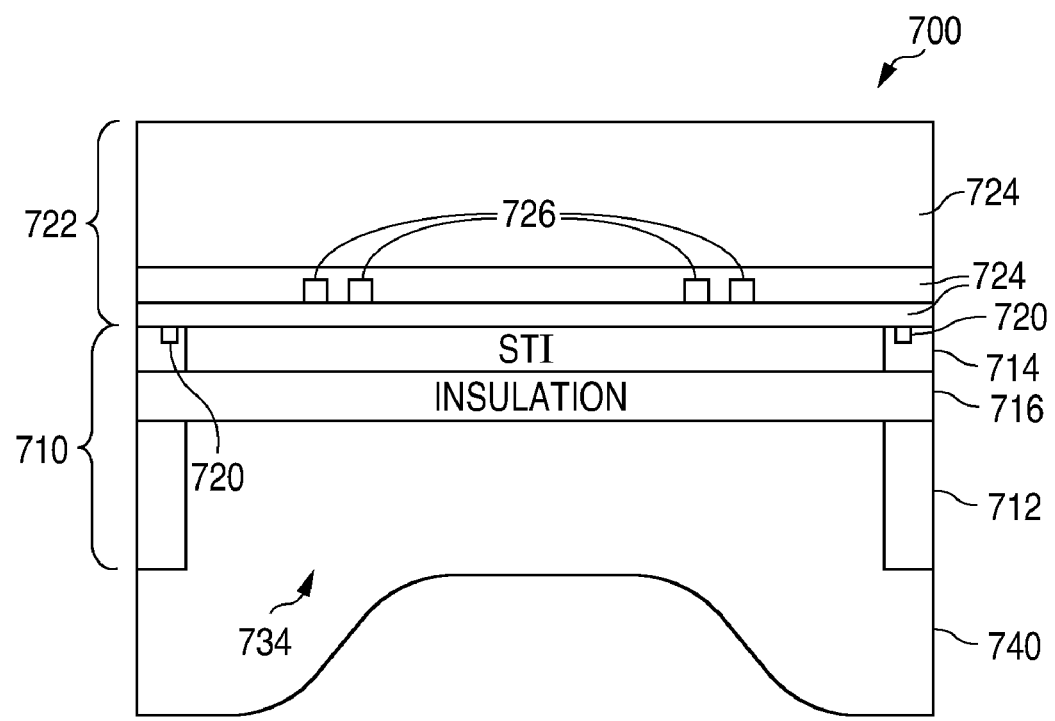

Following this, as shown in FIG. 7C, a photosensitive layer 740, which can be deposited in a low temperature setting that is compatible with back end processing, is formed on thinned bulk semiconductor region 712 to fill up opening 734. Photosensitive layer 740 can be implemented with an amorphous gallium arsenic (GaAs) layer.

Figure 7D:
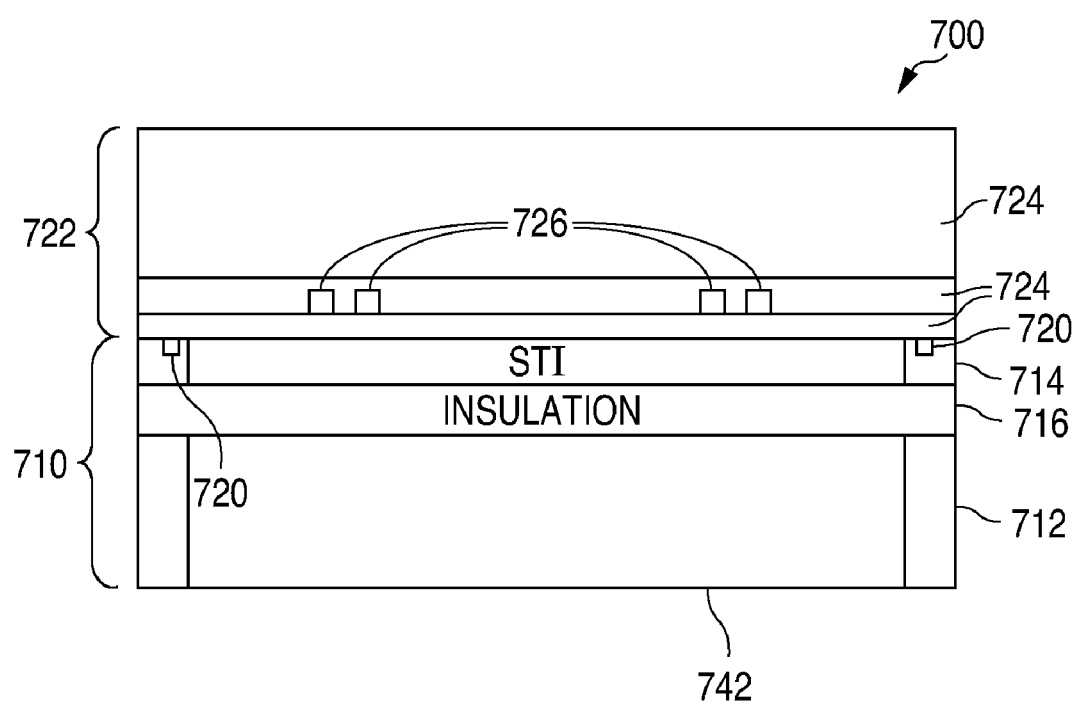

After photosensitive layer 740 has been deposited, as shown in FIG. 7D, wafer 700 is planarized in a conventional manner, such as with chemical-mechanical polishing, to remove photosensitive layer 740 from thinned bulk semiconductor region 712. The planarization forms an electron-hole generation region 742 from the photosensitive layer. Following this, the method continues with conventional back end processing steps.

Thus, an inductively-coupled photodetector and a method of forming an inductively-coupled photodetector have been described. One of the advantages of photodetector 200 is that since the figure of merit involved in sensing incident photons does not depend on carrier collection within the photosensitive material (electron-hole generation region 230), and thus no required contact with the material or carrier flow, the present invention has higher response frequencies, higher efficiency, and more flexible implementation options (i.e., the material used to form electron-hole generation region 230 can be selected based on the light frequency of interest).

Another advantage of the present invention is that in the absence of light, electron-hole generation region 230 must rapidly return to its initial equilibrium state to enable detection of subsequent light signals. The present invention provides a low (~1 psec) recombination lifetime when using GaAs, and allows the use of amorphous materials with simpler processing.

Thus, electron-hole generation region 230 can be formed from any material, such as an amorphous material, which has low temperature deposition requirements, the ability to generate more electron-hole pairs than the material of bulk semiconductor region 212 when exposed to a light frequency of interest, and a recombination lifetime that is sufficient to accommodate the frequency of the light signals.

Further, the formation of the shallow trench isolation region STI allows only a non-conductive material to lie between coil 226 and electron-hole generation region 230. As a result, only eddy currents in electron-hole generation region 230 have an effect on the strengths of the magnetic field B.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A photodetector comprising:
a semiconductor structure having:
an indirect band gap material having a top surface; and
a direct band gap material touching the indirect band gap material; and
a metal interconnect structure having:
a non-conductive region touching a top surface of the semiconductor structure; and
a coil touching the non-conductive region, and lying directly vertically over the direct band gap material.

2. The photodetector of claim 1 wherein no portion of the direct band gap material lies above the top surface of the indirect band gap material.

3. The photodetector of claim 1 wherein a bottom surface of the direct band gap material and a bottom surface of the indirect band gap material lie substantially in a common horizontal plane.

4. The photodetector of claim 3 wherein the direct band gap material includes gallium arsenic, and the indirect band gap material includes single-crystal silicon.

5. The photodetector of claim 1 wherein the semiconductor structure includes:
a substrate touching the non-conductive region; and
an insulation region having a bottom surface that touches the indirect band gap material, and a top surface that touches the substrate, the insulation region electrically isolating the indirect band gap material from the substrate.

6. The photodetector of claim 5 wherein the substrate is an indirect band gap material.

7. The photodetector of claim 5 wherein the direct band gap material touches the bottom surface of the insulation region.

8. The photodetector of claim 7 wherein a bottom surface of the direct band gap material and a bottom surface of the indirect band gap material lie substantially in a common horizontal plane.

9. The photodetector of claim 5 and further comprising a shallow trench isolation region that extends completely through the substrate to touch the insulation region.

10. The photodetector of claim 9 wherein the shallow trench isolation region lies directly vertically above the direct band gap material, and directly vertically below the coil.

11. The photodetector of claim 10 wherein the direct band gap material includes gallium arsenic, and the indirect band gap material includes single-crystal silicon.

12. The photodetector of claim 1 wherein only a non-conductive region lies vertically between the direct band gap material and the coil.

13. The photodetector of claim 1 and further comprising a number of devices that are formed in and on the substrate.

14. The photodetector of claim 13 wherein the number of devices are electrically connected together by way of the metal interconnect structure to form an inductance detector that measures changes in an inductance of the coil.

15. The photodetector of claim 1 wherein a magnetic field generated by a current flowing through the coil has a first strength when the direct band gap material is exposed to a wavelength of light, and a second strength when the direct band gap material is exposed to no light, the second strength being different from the first strength.

16. The photodetector of claim 1 wherein an inductance generated by a current flowing through the coil has a first value when the direct band gap material is exposed to a wavelength of light, and a second value when the direct band gap material is exposed to no light, the second value being different from the first value.

17. The photodetector of claim 1 wherein a larger number of electron-hole pairs are generated in the direct band gap material than are generated in an equivalently-sized region of the indirect band material when subject to equivalent input light conditions.

18. The photodetector of claim 1 wherein electron-hole pairs in the direct band gap material have shorter recombination lifetimes than do electron-hole pairs in an equivalently-sized region of the indirect band gap material.

19. A method of forming a photodetector comprising:

forming an opening in a region of indirect band gap material of a semiconductor structure, the opening lying directly vertically below a coil formed in a metal interconnect structure that touches a top surface of the semiconductor structure;

depositing a direct band gap material on a bottom surface of the indirect band gap material to fill up the opening; and removing the direct band gap material from the bottom surface of the indirect band gap material.

20. The method of claim 19 wherein the direct band gap material includes gallium arsenic, and the indirect band gap material includes single-crystal silicon.

* * * * *